(12) United States Patent
Kobayashi

(10) Patent No.: US 8,237,511 B2
(45) Date of Patent: Aug. 7, 2012

(54) LOCAL OSCILLATOR AND PHASE ADJUSTING METHOD FOR THE SAME

(75) Inventor: Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 12/885,767

(22) Filed: Sep. 20, 2010

(65) Prior Publication Data

US 2011/0234327 A1    Sep. 29, 2011

(30) Foreign Application Priority Data

Mar. 25, 2010  (JP) ................. 2010-069846

(51) Int. Cl.
*H03L 7/085* (2006.01)
*H03L 7/089* (2006.01)
*H03L 7/099* (2006.01)

(52) U.S. Cl. ........... 331/1 A; 331/1 R; 331/16; 375/376; 327/150; 327/159

(58) Field of Classification Search ........... 331/1 A, 331/1 R, 16; 375/376; 327/150, 159
See application file for complete search history.

(56) References Cited

U.S. PATENT DOCUMENTS

2008/0315960 A1* 12/2008 Waheed et al. .............. 331/17
2008/0317187 A1* 12/2008 Waheed et al. .............. 375/376

FOREIGN PATENT DOCUMENTS

| JP | 09-247137 | 9/1997 |
|---|---|---|
| JP | 2001-060864 | 3/2001 |
| JP | 2002-064376 | 2/2002 |
| JP | 2009-021954 | 1/2009 |

OTHER PUBLICATIONS

Grollitsch, et al. A 1.4psrms-Period-Jitter TDC-Less Fractional-N Digital PLL with Digitally Controlled Ring Oscillator in 65nm CMOS, 2010 IEEE International Solid-State Circuits Conference.
Staszewski, et al. Phase-Domain All-Digital Phase-Locked Loop, IEEE Transactions on Circuits and Systems II, vol. 52, No. 3, Mar. 2005, pp. 159-163.

* cited by examiner

*Primary Examiner* — Arnold Kinkead
*Assistant Examiner* — Richard Tan
(74) *Attorney, Agent, or Firm* — Turocy & Watson, LLP

(57) ABSTRACT

According to one embodiment, a local oscillator includes: an adder that adds an oscillator integer phase and an oscillator fraction phase and outputs the addition value as first phase information; a delayer that outputs an addition output of a frequency command word at one clock before and second phase information as estimated oscillator phase data; a correcting unit that outputs an addition of compensation information to the first phase information as the second phase information when |the first phase information−the estimated oscillator phase data|>|the first phase information+the compensation information−the estimated oscillator phase data| is satisfied and otherwise outputs the first phase information as the second phase information.

8 Claims, 8 Drawing Sheets

LOCAL OSCILLATOR AND PHASE ADJUSTING METHOD FOR THE SAME

CROSS-REFERENCE TO RELATED APPLICATIONS

This application is based upon and claims the benefit of priority from Japanese Patent Application No. 2010-069846, filed on Mar. 25, 2010; the entire contents of which are incorporated herein by reference.

FIELD

Embodiments described herein relate generally to a local oscillator and a phase adjusting method for the same.

BACKGROUND

In recent years, all digital phase locked loop (ADPLL) circuits where all control signals of phase locked loop (PLL) circuits are digitized are used in wireless communication devices such as wireless LAN devices (for example, see Japanese Patent Application Publication (KOKAI) No. 2009-21954). Since analog circuits are replaced by digital circuits in ADPLL circuits, it is possible to save space and power due to progress in processes.

An ADPLL circuit includes a digital loop filter, a digitally-controlled oscillator (DCO), a counter and a time-to-digital converter (TDC). The counter counts an output CKV of the DCO and outputs a count value based on a reference signal synchronized with the outputs CKV of the DCO. The TDC obtains a phase difference of one cycle or less of an output CKV of the DCO in synchronization with the reference signal REF. A comparison result (difference) between a value obtained by adding the count value to the phase difference d and a phase control signal is supplied to the digital loop filter. The oscillation frequency of the DCO is controlled based on the output of the digital loop filter.

The output CKV of the DCO and the reference signal REF are asynchronous. That is, in the ADPLL circuit, the respective outputs from the two circuits (the counter and the TDC) that operate with asynchronous clocks are added in the same circuit. Thus, the read value of the counter may be shifted, which causes unstable PLL operation.

In particular, disadvantages lie in that (1) the circuit for obtaining phase information from the output CKV of the DCO is constituted by two circuits (the counter and the TDC) having different functions and that (2) the output of the counter is the reference signal REF synchronized with the output CKV of the DCO.

DETAILED DESCRIPTION

In general, according to one embodiment, a local oscillator includes: a digitally-controlled oscillator that outputs an oscillator output signal having an oscillation frequency according to an oscillator tuning word; a counter that counts the oscillator output signal and outputs a count value as an oscillator integer phase based on a reference signal synchronized with the oscillator output signal; a time-to-digital converter that outputs a phase difference between the oscillator output signal and the reference signal as an oscillator fraction phase, and also outputs compensation information of "−1" when a phase of the oscillator output signal is delayed by more than a half cycle of the oscillator output signal with respect to a phase of the reference signal and otherwise outputs compensation information of "+1"; an adder that adds the oscillator integer phase and the oscillator fraction phase and outputs the addition value as first phase information; a delayer that outputs an addition output of a frequency command word at one clock before and second phase information as estimated oscillator phase data; a correcting unit that outputs an addition of the compensation information to the first phase information as the second phase information when |the first phase information−the estimated oscillator phase data|>|the first phase information+the compensation information−the estimated oscillator phase data| is satisfied and otherwise outputs the first phase information as the second phase information; and a filter that smoothes a difference between reference phase data for setting the oscillation frequency of the digitally-controlled oscillator and the second phase information and outputs the oscillator tuning word.

Exemplary embodiments of a local oscillator and a phase adjusting method for the same will be described below in detail with reference to the attached drawings. The present invention is not limited to the embodiments.

Figure 1:
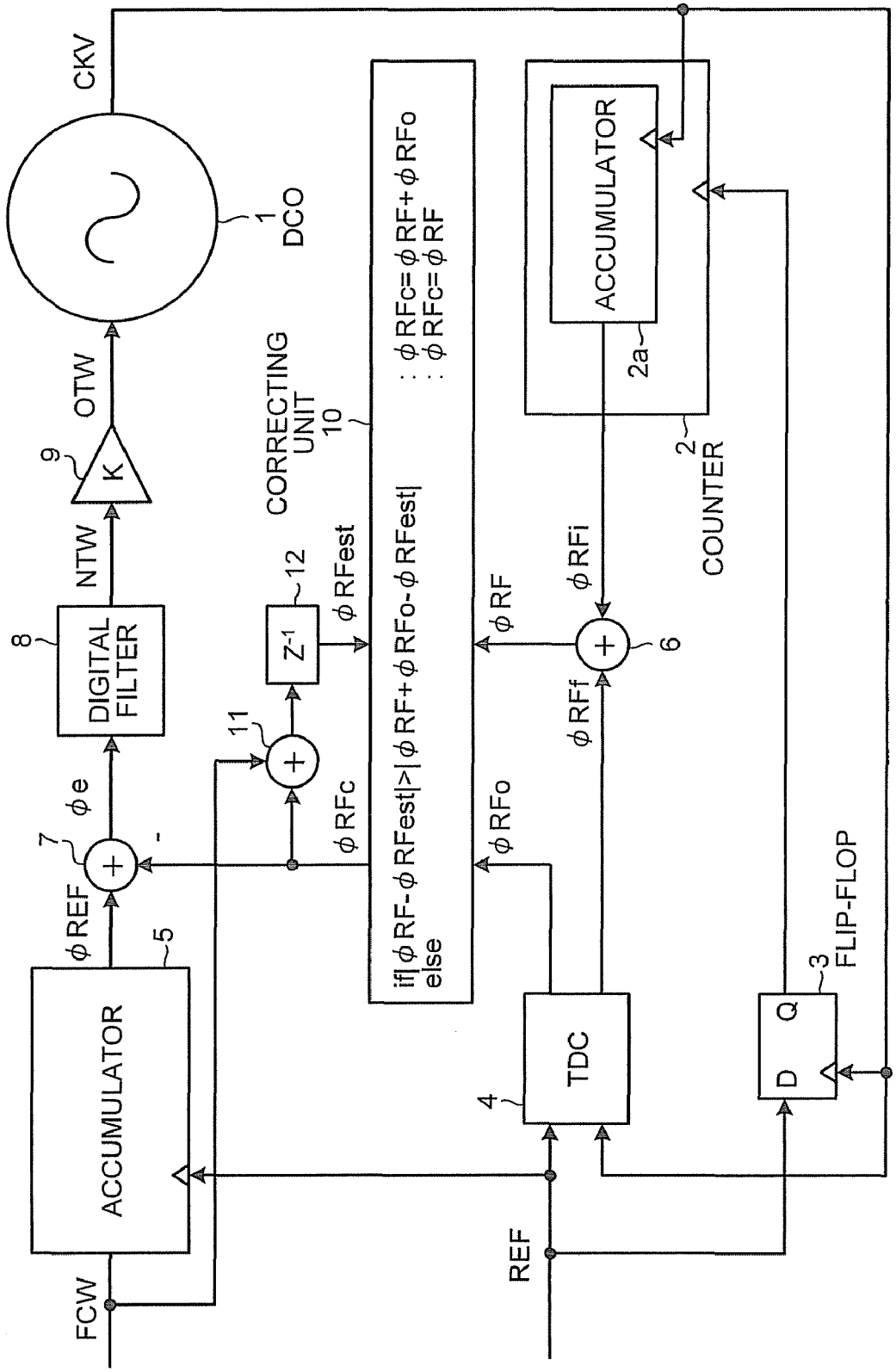
FIG. 1 illustrates a schematic configuration of an all digital phase locked loop (ADPLL) according to a first embodiment.
Figure 2A:
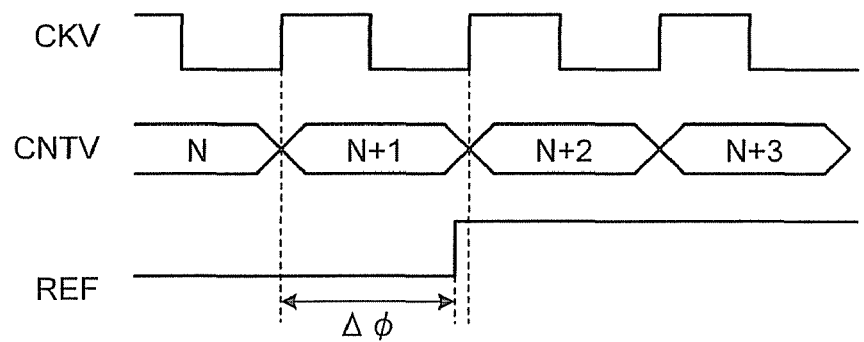
FIGS. 2A and 2B are timing charts for explaining a shift from an expected value of a counter.
Figure 2B:
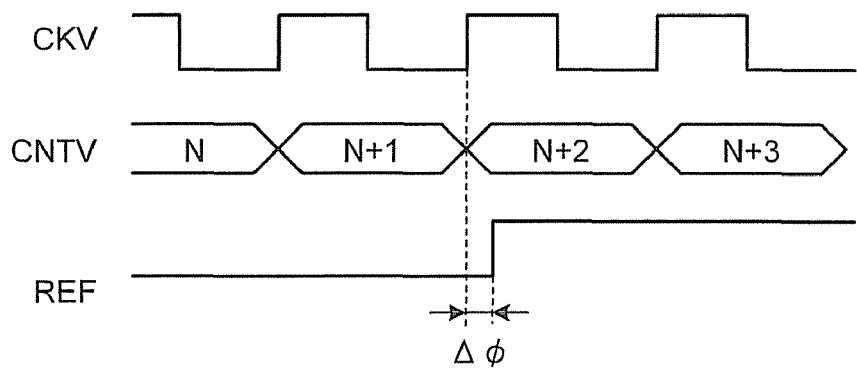

First Embodiment:

FIG. 1 illustrates a schematic configuration example of an all digital phase locked loop (ADPLL) according to a first embodiment. FIGS. 2A and 2B are timing charts for explaining a shift from an expected value of a counter.

In the related art, the shift from an expected value of a counter will be described with reference to FIGS. 2A and 2B. Since the oscillator output signal CKV from the DCO and the reference signal REF are asynchronous as described above, a value read from the counter may be shifted from an expected value. As illustrated in FIGS. 2A and 2B, the shift from an expected value of the counter is more likely to occur when an edge of the reference signal REF is close to that of the oscillator output signal CKV. A phase difference Δϕ output from the TDC is to be added to a value N output from the counter. However, when the rise of the reference signal REF is close to that of the oscillator output signal CKV, such as when the reference signal REF rises slightly earlier than the oscillator output signal CKV as illustrated in FIG. 2A, the output CNTV of the counter 2 may be shifted and thus the phase difference $\Delta\phi$ and a value N+1 may be added (correct data: N+1+$\Delta\phi$; erroneous data: N+2+$\Delta\phi$). On the other hand, when the reference signal REF rises slightly later than the oscillator output signal CKV as illustrated in FIG. 2B, the output value CNTV of the counter may be shifted and thus the phase difference $\Delta\phi$ and the value N may not be added (correct data: N+2+$\Delta\phi$; erroneous data: N+1+$\Delta\phi$).

In the present embodiment, the error rate in asynchronous reading of phase information is reduced by comparing the phase information itself of the DCO 1 and a predicted value in a complex manner.

The ADPLL according to the present embodiment includes the DCO 1, the counter 2, a flip-flop 3, the TDC 4, an accumulator 5, an adder 6, a subtractor 7, a digital filter 8, a gain corrector 9, a correcting unit 10, an adder 11 and a delayer 12, as illustrated in FIG. 1.

The DCO 1 is an oscillator that can discretely control the oscillation frequency with an oscillator tuning word OTW, and outputs an oscillator output signal CKV according to the oscillator tuning word OTW. The DCO 1 is realized by two-value control of a plurality of (MOS) varactors, for example.

The oscillator output signal CKV of the DCO 1 is input as a clock input to the flip-flop 3, which latches and outputs a value of the reference signal REF. That is, the output signal of the flip-flop 3 is the reference signal REF that is synchronized with the oscillator output signal CKV of the DCO 1.

The counter 2 includes an accumulator 2a to which the oscillator output signal CKV of the DCO 1 is supplied as a clock. The output signal of the flip-flop 3 is supplied as a clock to the counter 2, which outputs a count value of the accumulator 2a as an oscillator integer phase $\phi$RFi in synchronization with the clock to the adder 6. That is, the counter 2 is a circuit that operates in synchronization with the oscillator output signal CKV of the DCO 1.

The TDC 4 is a timing measurement device that can digitally represent the phase difference between the oscillator output signal CKV of the DCO 1 and the reference signal REF with finer precision than a cycle of the oscillator output signal CKV of the DCO 1. The TDC 4 is a circuit that operates in synchronization with the reference signal REF. That is, the TDC 4 operates with a clock that is asynchronous with the counter 2. The TDC 4 outputs the phase difference between the oscillator output signal CKV and the reference signal REF as an oscillator fraction phase $\phi$RFf to the adder 6. The TDC 4 also outputs compensation information $\phi$RF$_0$ of "−1" when the phase of the oscillator output signal CKV is delayed by more than a half cycle of the oscillator output signal CKV with respect to the phase of the reference signal REF and otherwise outputs compensation information $\phi$RF$_0$ of "+1" to the correcting unit 10.

The adder 6 adds $\phi$RFi output from the counter 2 and $\phi$RFf output from the TDC 4 and outputs the addition result as oscillator phase data (first phase information) $\phi$RF to the correcting unit 10. The adder 11 adds a frequency command word FCW and error compensated oscillator phase data (second phase information) $\phi$RFc and outputs the addition result. The delayer 12 outputs an addition output of FCW at one clock before and $\phi$RFc as estimated oscillator phase data $\phi$RFest to the correcting unit 10.

$\phi$RF$_0$, $\phi$RF and $\phi$Rfest are input to the correcting unit 10, which outputs $\phi$RFc=$\phi$RF+$\phi$RF$_0$ when |$\phi$RF−$\phi$RFest|>|$\phi$F+$\phi$RF$_0$−$\phi$RFest| is satisfied and otherwise outputs $\phi$RFc=$\phi$RF to the subtractor 7 and the adder 11.

The accumulator 5 integrates a value obtained by normalizing FCW with the reference signal REF and outputs the integrated value as reference phase data $\phi$REF to the subtractor 7. The subtractor 7 calculates a difference between the reference phase data $\phi$REF and the error compensated oscillator phase data $\phi$RFc output from the correcting unit 10 and outputs the subtraction result as phase error data $\phi$e to the digital filter 8.

The digital filter 8 operates as a low-pass filter that smoothes the supplied phase error data $\phi$e and outputs the smoothed data as a normalized tuning word NTW to the gain corrector 9.

The gain corrector 9 multiplies the output value of the digital filter 8 by a factor K and outputs an oscillator tuning word OTW. By the multiplication by the factor K, the frequency gain to a tuning value of the DCO 1 is corrected.

When the oscillation frequency of the DCO 1 becomes higher (or lower) than a value set by FCW, an oscillator tuning word OTW that controls the oscillation frequency to be lower (or higher) is output through the digital filter 8 and the gain corrector 9 based on the phase error data $\phi$e calculated by the subtractor 7. The oscillation frequency of the DCO 1 is controlled to be constant in this manner.

Even if the count value CNTV to be added to the phase difference is shifted due to asynchronous operations of the counter 2 and the TDC 4, the shifted amount can be corrected by the correcting unit 10. Accordingly, malfunction can be prevented and stability of the PLL operation can be improved. Further, by compensating the frequency phase information (integrated value), the effect of the error compensation on the error can be controlled to be minimum.

Figure 3:
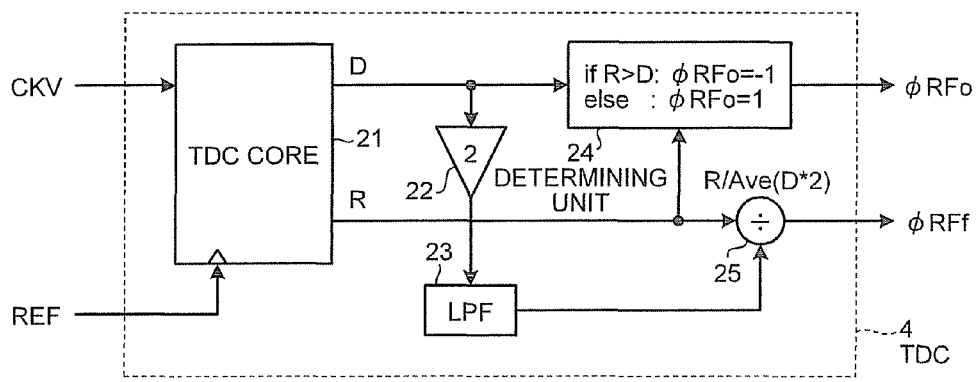
FIG. 3 is a diagram illustrating a configuration example of a TDC.

FIG. 3 is a diagram illustrating a specific configuration example of the TDC 4. The TDC 4 includes a TDC core 21, a multiplier 22 that outputs a doubled value of an input, a LPF 23, a divider 25 and a determining unit 24, as illustrated in FIG. 3. The TDC core 21 uses the reference signal REF to detect and count the oscillator output signal CKV input from the DCO 1 at rise edges and fall edges thereof, outputs an R value (rise edge) in a unit of one cycle of the oscillator output signal CKV to the determining unit 24 and the divider 25 and outputs a D value (|rise edge−fall edge|) to the determining unit 24 and the multiplier 22.

The multiplier 22 doubles the frequency of the D value and outputs D*2 to the LPF 23. The LPF 23 cuts off a high frequency component of D*2 and outputs the resulting value to the divider 25. The divider 25 calculates R/AVE(D*2) and outputs $\phi$RFf normalized at an interval of the CKV to the adder 6. The determining unit 24 outputs $\phi$RF$_0$=−1 when R value>D value is satisfied and otherwise outputs $\phi$RF$_0$=1 to the correcting unit 10.

Figure 4:
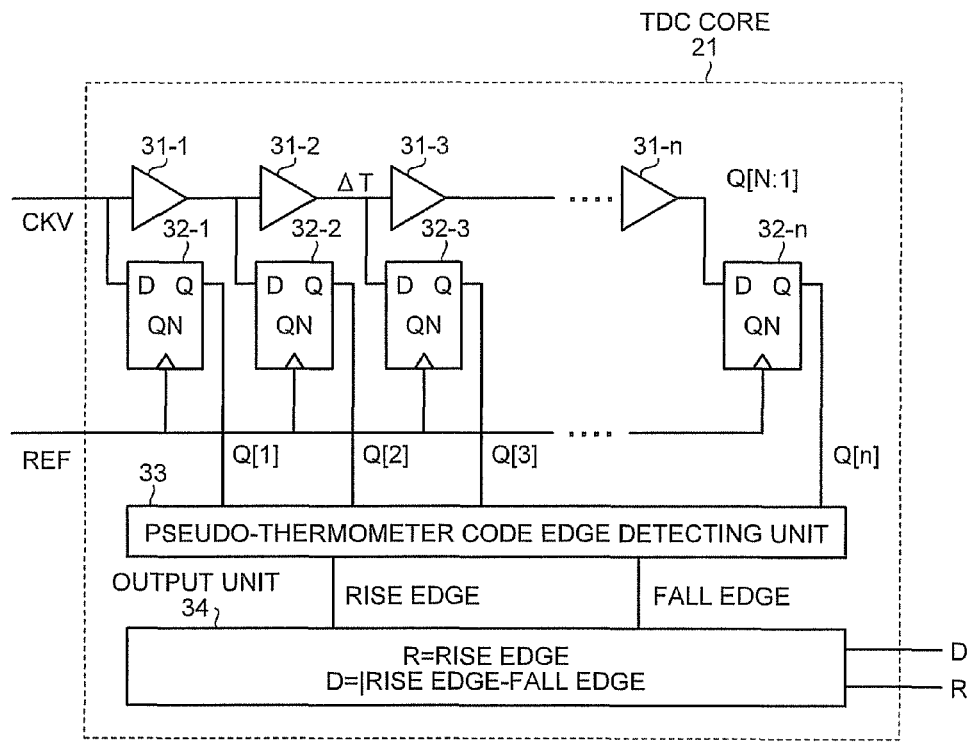
FIG. 4 is a diagram illustrating a configuration example of a TDC core.

FIG. 4 is a diagram illustrating a configuration example of the TDC core 21. The TDC core 21 includes a plurality of delay circuits 31-1 to 31-n connected in series, a plurality of flip-flops 32-1 to 32-n associated one-to-one with the delay circuits 31-1 to 31-n, respectively, a pseudo-thermometer code edge detecting unit 33 and an output unit 34.

The oscillator output signal CKV of the DCO 1 is input to the first stage delay circuit 31-1 of the delay circuits 31-1 to 31-n. The delay circuits 31-1 to 31-n sequentially delay the oscillator output signal CKV of the DCO 1 and output the delayed signal. The delay time of each of the delay circuits 31-1 to 31-n is $\Delta$T.

The flip-flops 32-1 to 32-n capture the outputs of the respective delay stages of the delay circuits 31-1 to 31-n in response to the reference signal REF commonly input to clock input terminals of the respective flip-flops 32-1 to 32-n, and output Q[1] to Q[N] to the pseudo-thermometer code edge detecting unit 33.

The pseudo-thermometer code edge detecting unit 33 detects and counts rise edges and fall edges of the respective output signals Q[1] to Q[N] of the flip-flops 32-1 to 32-n and outputs the count value to the output unit 34. The output unit 34 outputs the R value (count value of rise edge) to the determining unit 24 and the divider 25, and also outputs the D value (|count value of rise edge−count value of fall edge|) to the determining unit 24 and the multiplier 22.

Figure 5:
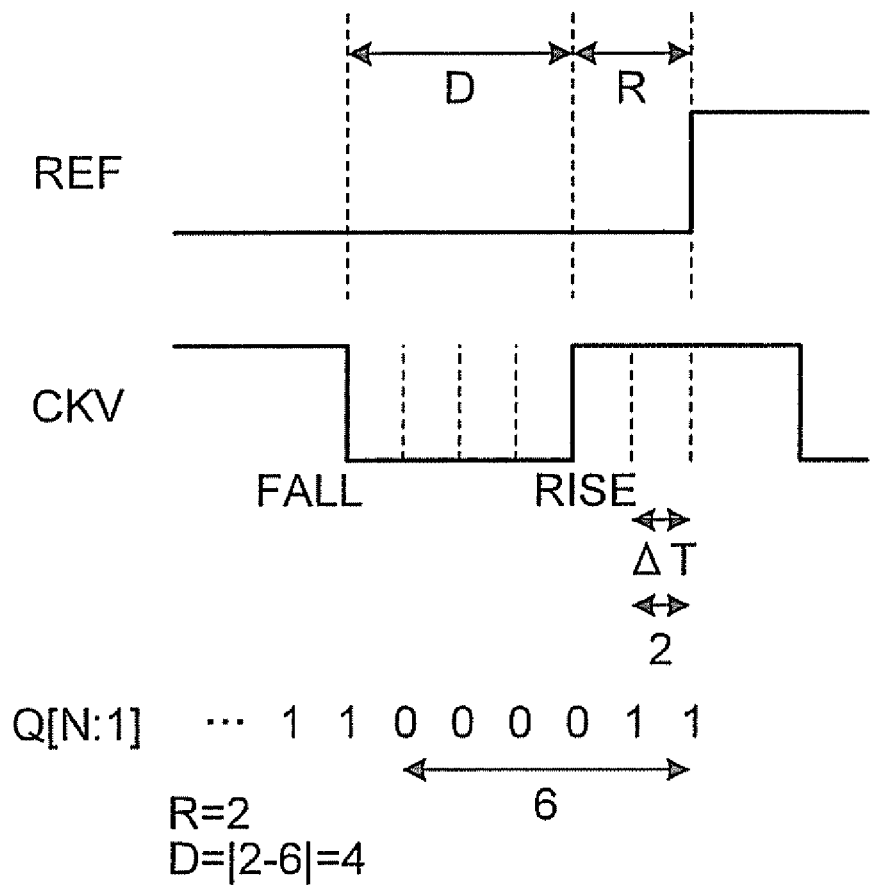
FIG. 5 is a diagram illustrating an example of a timing chart of signals in the TDC core.

FIG. 5 is a diagram illustrating an example of a timing chart of the signals in the TDC core 21. In the example illustrated in FIG. 5, the R value is 2, an F value is 6, and the D value is |2−6|=4.

As described above, according to the first embodiment, by providing the DCO 1 that outputs the oscillator output signal CKV having an oscillation frequency according to the oscillator tuning word OTW; the counter 2 that counts the oscillator output signal CKV and outputs the count value as the oscillator integer phase φRFi based on the reference signal REF synchronized with the oscillator output signal CKV; the TDC 4 that outputs the oscillator fraction phase φRFf, which is the phase difference between the oscillator output signal CKV and the reference signal REF, and also outputs compensation information φRF$_0$ of "−1" when the phase of the oscillator output signal CKV is delayed by more than a half cycle of the oscillator output signal CKV with respect to the phase of the reference signal REF and otherwise outputs compensation information φRF$_0$ of "+1"; the adder 6 that adds the oscillator integer phase φRFi and the oscillator fraction phase φRFf and outputs the addition value as the oscillator phase data (first phase information) φRF; the delayer 12 that outputs the addition output of FCW at one clock before and the error compensated oscillator phase data (second phase information) φRFc as the estimated oscillator phase data φRFest; the correcting unit 10 that outputs φRFc=φRF+φRF$_0$ when |φRF−φRFest|>|φF+φRF$_0$−φRFest| is satisfied and otherwise outputs φRFc=φRF to the subtractor 7 and the adder 11; and the filter 8 that smoothes the difference between φREF and φRFc and outputs NTW, it is possible to stabilize the PLL operation even when the output of the DCO and the reference signal REF are asynchronous, that is, even when the read value of the counter is shifted.

Figure 6:
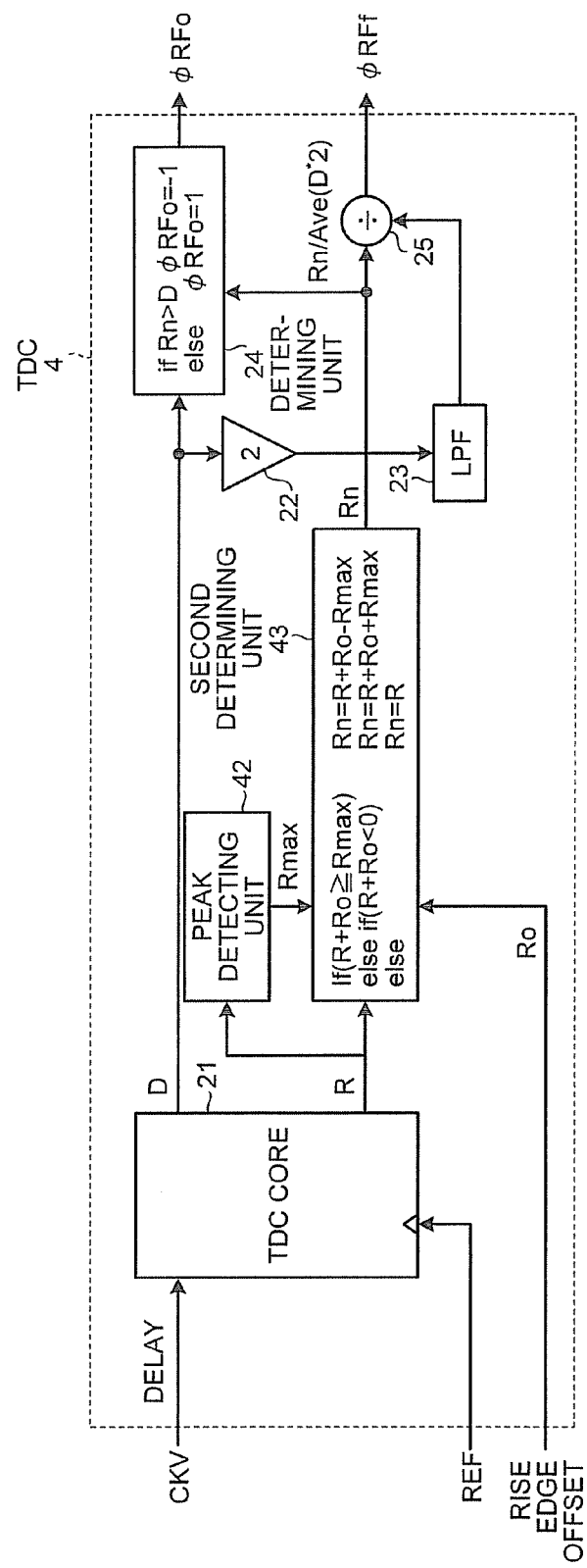
FIG. 6 is a diagram illustrating a configuration example of a TDC according to a second embodiment.

Second Embodiment:

FIG. 6 is a diagram illustrating a configuration example of a TDC according to a second embodiment. The TDC 4 according to the second embodiment is configured to externally add error information (offset) to φRFf of the TDC 4 and compensate a shifted amount of operation timings between circuits of the TDC 4 and the counter 2 with respect to the reference signal REF to correct error with higher precision.

In FIG. 6, the same reference numerals are allotted to the components having functions equivalent to those in FIG. 3 and only the difference therefrom will be described. The TDC 4 according to the second embodiment further includes a peak detecting unit 42 and a second determining unit 43 in addition to the components of the TDC 4 according to the first embodiment (see FIG. 3).

Although the counter 2 and the TDC 4 operate with the same CKV, there may be a delay between the counter 2 and the TDC 4 because they are circuits of different systems. The example illustrated in FIG. 6 shows a case in which the CKV is delayed. The TDC 4 according to the second embodiment is configured to be capable of externally adding error information (offset) R$_0$ to information of the rise edges of the CKV. This can change an effective phase detecting point of the TDC 4 and allows the phases of the reference signals REF respectively controlling the two circuits located at different positions, that is the counter 2 and the TDC 4, to be closer. Consequently, the precision of detecting malfunction can be improved as compared to the first embodiment.

In a system in which the offset is considered, a peak detecting unit 42 that has received more than one cycle of data is necessary to represent a number less than the offset amount.

In FIG. 6, the peak detecting unit 42 is to determine that more than a cycle of data has been received, and detects the peak of the R value input from the TDC core 21 to output a peak value Rmax to the second determining unit 43. The R value, Rmax and R$_0$ (rise edge offset: error information) are input to the second determining unit 43. The second determining unit 43 outputs Rn=R+R$_0$−Rmax when R+R$_0$≧Rmax is satisfied, Rn=R+R$_0$+Rmax when R+R$_0$<0 is satisfied, and otherwise Rn=R to the determining unit 24 and the divider 25.

Figure 7:
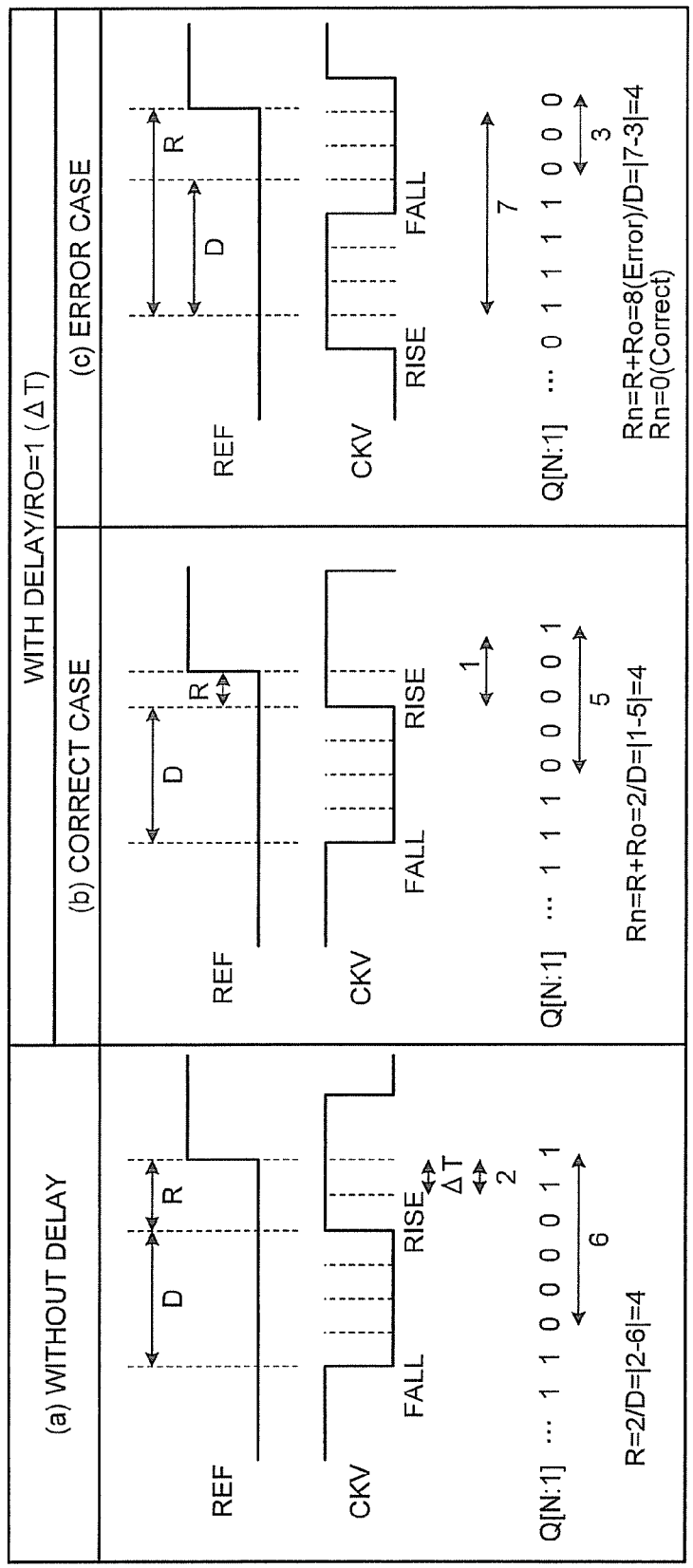
FIG. 7 is a diagram for explaining the reason why the precision of detecting malfunction can be improved with the TDC of the second embodiment.

FIG. 7 is a diagram for explaining the reason why the precision of detecting malfunction can be improved with the TDC of the second embodiment, in which (a) shows a case where the CKV is not delayed, (b) shows a case where the CKV is delayed but can be correctly detected, and (c) shows a case where the CKV is delayed and an error is detected in the first embodiment while such error is not detected in the second embodiment. Here, R$_0$ is 1 and Rmax is 8.

In the example illustrated in (a), the CKV is not delayed, and the R value is 2, the F value is 6 and the D value is |2−6|=4. In the example illustrated in (b), the CKV is delayed, but Rn=R+R$_0$=2 is obtained and the D value is |1−5|=4. Thus, the CKV can be correctly detected. In the example shown in (c), Rn=R+R$_0$=8 is an error under normal circumstances. However, since the determining unit 43 outputs Rn=R+R$_0$−Rmax=0 when R+R$_0$≧Rmax is satisfied, it is possible to prevent false detection.

According to the second embodiment, since the error information (offset) is externally added to φRFf of the TDC 4, the error can be corrected with higher precision by compensating the shifted amount of operation timings between circuits of the TDC 4 and the counter 2 with respect to the reference signal REF.

Figure 8:
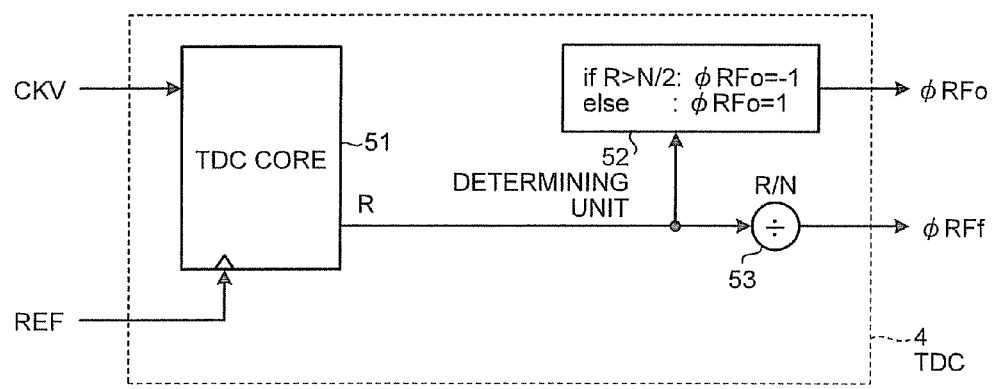
FIG. 8 is a diagram illustrating a configuration example of a TDC according to a third embodiment.

Third Embodiment:

FIG. 8 is a diagram illustrating a configuration example of a TDC according to a third embodiment. The TDC 4 according to the third embodiment outputs the R value at a certain interval N with respect to the cycle of the CKV by controlling the delay amount of the CKV by the TDC. Accordingly, it is not necessary to calculate and determine the cycle data.

In FIG. 8, the same reference numerals are allotted to the components having functions equivalent to those in FIG. 3 and only the difference therefrom will be described. The TDC 4 according to the third embodiment includes a TDC core 51, a determining unit 52 and a divider 53. The TDC core 51 detects and counts the reference signal REF at rise edges of the oscillator output signal CKV input from the DCO 1, and outputs the R value at a certain interval N with respect to the cycle of the CKV. The determining unit 52 outputs φRF$_0$=−1 when R value>N/2 (=N÷2) is satisfied and otherwise outputs φRF$_0$=1 to the correcting unit 10. The divider 25 calculates R value/N (=R value÷N) and outputs φRFf to the adder 6.

Figure 9:
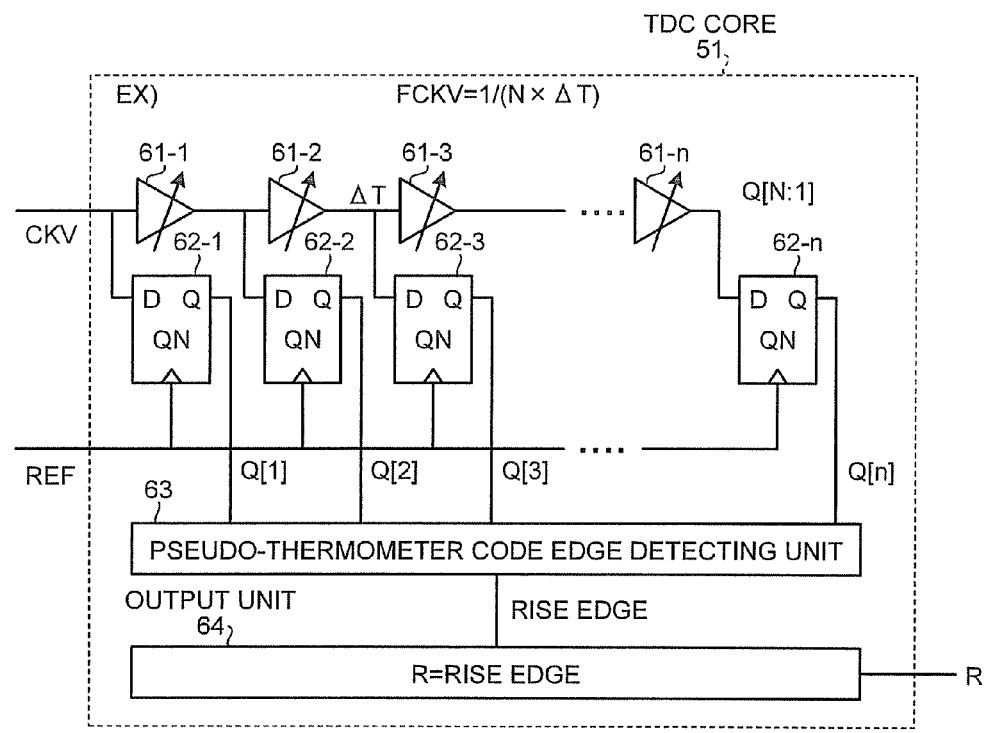
FIG. 9 is a diagram illustrating a configuration example of a TDC core.
Figure 10:
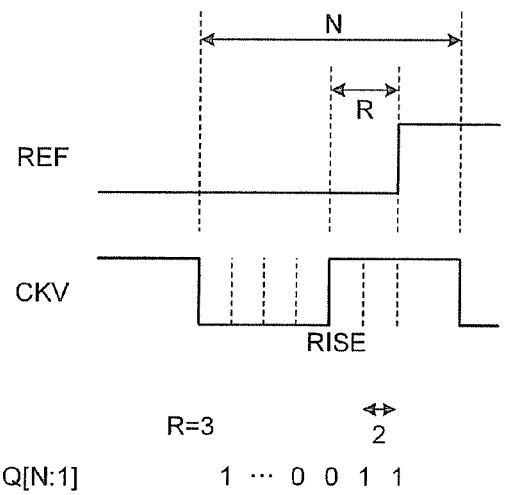
FIG. 10 is a diagram illustrating an example of a timing chart of signals in the TDC core.

FIG. 9 is a diagram illustrating a configuration example of the TDC core 51. FIG. 10 is a diagram illustrating an example of a timing chart of the signals in the TDC core 51. The TDC core 51 includes a plurality of variable delay circuits 61-1 to 61-n connected in series, a plurality of flip-flops 62-1 to 62-n associated one-to-one with the variable delay circuits 61-1 to 61-n, respectively, a pseudo-thermometer code edge detecting unit 63 and an output unit 64.

The oscillator output signal CKV of the DCO 1 is input to the first stage delay circuit 61-1 of the variable delay circuits 61-1 to 61-n. The variable delay circuits 61-1 to 61-n sequentially delay the oscillator output signal CKV of the DCO 1 and output the delayed signal. The delay time ΔT of each of the variable delay circuits 61-1 to 61-*n* is set by the pseudo-thermometer code edge detecting unit 63. The delay amount ΔT is set such that the frequency FCKV of the CKV satisfies FCKV=1/(N×ΔT).

The flip-flops 62-1 to 62-*n* capture the outputs of the respective delay stages of the variable delay circuits 61-1 to 61-*n* in response to the reference signal REF commonly input to clock input terminals of the respective flip-flops 62-1 to 62-*n*, and output Q[1] to Q[N] to the pseudo-thermometer code edge detecting unit 63.

The pseudo-thermometer code edge detecting circuit 63 detects and counts rise edges of the respective output signals Q[1] to Q[N] of the flip-flops 62-1 to 62-*n* and outputs the count value to the output unit 64. The output unit 64 outputs the R value (count value of rise edge) to the determining unit 52 and the divider 53.

FIG. 10 is a diagram illustrating an example of a timing chart of the signals in the TDC core 51. In the example illustrated in FIG. 10, the R value is output at a certain interval N with respect to the cycle of the CKV and R is 3.

Figure 11:
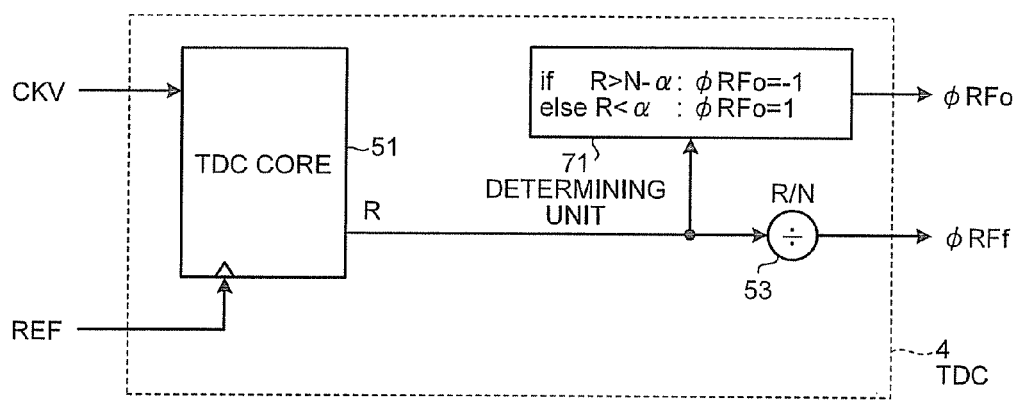
FIG. 11 is a diagram illustrating a configuration example of a TDC according to a modified example.

In the above-described embodiments, the determination is made based on whether the phase state is larger or smaller than π. However, the determination may be made based on any value ±π/a (a is any number equal to or larger than 1) near a phase transition point. FIG. 11 is a diagram illustrating a configuration example of a TDC 4 according to a modified example of FIG. 8. In FIG. 11, the same reference numerals are allotted to the components having functions equivalent to those in FIG. 8 and only the difference therefrom will be described. In FIG. 11, a determining unit 71 outputs $\phi RF_0 = -1$ when R value>N−α is satisfied and otherwise outputs $\phi RF_0 = 1$ to the correcting unit 10.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A local oscillator comprising:
 a digitally-controlled oscillator that outputs an oscillator output signal having an oscillation frequency according to an oscillator tuning word;
 a counter that counts the oscillator output signal and outputs a count value as an oscillator integer phase based on a reference signal synchronized with the oscillator output signal;
 a time-to-digital converter that outputs a phase difference between the oscillator output signal and the reference signal as an oscillator fraction phase, and also outputs compensation information of "−1" when a phase of the oscillator output signal is delayed by more than a half cycle of the oscillator output signal with respect to a phase of the reference signal and otherwise outputs compensation information of "+1";
 an adder that adds the oscillator integer phase and the oscillator fraction phase and outputs the addition value as first phase information;
 a delayer that outputs an addition output of a frequency command word at one clock before and second phase information as estimated oscillator phase data;
 a correcting unit that outputs an addition of the compensation information to the first phase information as the second phase information when |the first phase information−the estimated oscillator phase data|>|the first phase information+the compensation information−the estimated oscillator phase data| is satisfied and otherwise outputs the first phase information as the second phase information; and
 a filter that smoothes a difference between reference phase data for setting the oscillation frequency of the digitally-controlled oscillator and the second phase information and outputs the oscillator tuning word.

2. The local oscillator according to claim 1, wherein the time-to-digital converter includes:
 a TDC core that detects and counts the reference signal REF at rise edges and fall edges of the oscillator output signal and outputs an R value (rise edge) and a D value (|rise edge−fall edge|) in a unit of one cycle of the oscillator output signal;
 a multiplier that doubles a frequency of the D value and outputs the doubled frequency; a filter that cuts off a high frequency component of the output from the multiplier and outputs the resulting value;
 a divider that normalizes the output from the filter at an interval of the oscillator output signal and outputs the normalized value as the oscillator fraction phase; and
 a determining unit that outputs "−1" as the compensation information when the R value>the D value is satisfied and otherwise outputs "1" as the compensation information.

3. The local oscillator according to claim 1, wherein an offset is externally added to the oscillator fraction phase output from the time-to-digital converter.

4. The local oscillator according to claim 1, wherein the time-to-digital converter includes:
 a TDC core that detects and counts the reference signal at rise edges of the oscillator output signal and outputs an R value (rise edge) at an interval N with respect to a cycle of the oscillator output signal;
 a divider that calculates the R value÷N and outputs the calculation result as the oscillator fraction phase; and
 a determining unit that outputs "−1" as the compensation information when the R value>N÷2 is satisfied and otherwise outputs "1" as the compensation information.

5. A phase adjusting method for a local oscillator comprising:
 outputting, by a digitally-controlled oscillator, an oscillator output signal having an oscillation frequency according to an oscillator tuning word;
 counting the oscillator output signal and outputting a count value as an oscillator integer phase based on a reference signal synchronized with the oscillator output signal;
 outputting a phase difference between the oscillator output signal and the reference signal as an oscillator fraction phase, and also outputting compensation information of "−1" when a phase of the oscillator output signal is delayed by more than a half cycle of the oscillator output signal with respect to a phase of the reference signal while otherwise outputting compensation information of "+1";
 adding the oscillator integer phase and the oscillator fraction phase and outputting the addition value as first phase information;
 outputting an addition output of a frequency command word at one clock before and second phase information as estimated oscillator phase data;

outputting an addition of the compensation information to the first phase information as the second phase information when |the first phase information−the estimated oscillator phase data|>|the first phase information+the compensation information−the estimated oscillator phase data| is satisfied while otherwise outputting the first phase information as the second phase information; and smoothing a difference between reference phase data for setting the oscillation frequency of the digitally-controlled oscillator and the second phase information and outputting the oscillator tuning word.

6. The method according to claim 5, wherein the step of outputting the compensation information includes:

detecting and counting the reference signal at rise edges and fall edges of the oscillator output signal and outputting an R value (rise edge) and a D value (|rise edge−fall edge|) in a unit of one cycle of the oscillator output signal;

doubling a frequency of the D value and outputting the doubled frequency;

cutting off a high frequency component of the output obtained by doubling the frequency of the D value and outputting the resulting value;

normalizing the output from the filter at an interval of the oscillator output signal and outputting the normalized value as the oscillator fraction phase; and outputting "−1" as the compensation information when the R value>the D value is satisfied while otherwise outputting "1" as the compensation information.

7. The method according to claim 5, wherein an offset is externally added to the oscillator fraction phase.

8. The method according to claim 5, wherein the step of outputting the compensation information includes:

detecting and counting the reference signal at rise edges of the oscillator output signal and outputting an R value (rise edge) at an interval N with respect to a cycle of the oscillator output signal;

calculating the R value÷N and outputting the calculation result as the oscillator fraction phase; and outputting "−1" as the compensation information when the R value>N÷2 is satisfied while otherwise outputting "1" as the compensation information.

* * * * *